(12) United States Patent
Pfirsch

(10) Patent No.: US 6,445,048 B1
(45) Date of Patent: Sep. 3, 2002

(54) SEMICONDUCTOR CONFIGURATION HAVING TRENCHES FOR ISOLATING DOPED REGIONS

(75) Inventor: Frank Pfirsch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/657,074

(22) Filed: Sep. 7, 2000

Related U.S. Application Data

(63) Continuation of application No. PCT/DE99/00012, filed on Jan. 7, 1999.

(51) Int. Cl.$^7$ ............................................. H01L 29/772
(52) U.S. Cl. ..................... 257/393; 257/93; 257/329; 257/330; 257/374; 257/393; 257/446; 257/499; 257/501; 257/506; 257/510; 257/513; 257/519; 257/520
(58) Field of Search ................................ 257/329, 330, 257/321, 334, 500, 501, 510, 520, 93, 374, 446, 499, 524, 506, 513, 519

(56) References Cited

U.S. PATENT DOCUMENTS

| | | | |
|---|---|---|---|
| 3,994,011 A | 11/1976 | Misawa et al. | |
| 5,430,324 A | 7/1995 | Bencuya | |
| 5,525,821 A | 6/1996 | Harada et al. | |
| 5,567,635 A | * 10/1996 | Acovic et al. | 437/43 |
| 6,198,151 B1 | * 3/2001 | Wada | 257/520 |

FOREIGN PATENT DOCUMENTS

| | | | |
|---|---|---|---|
| DE | 196 50 599 A1 | * 10/1998 | |
| EP | 19650599 A1 | * 6/1996 | |
| GB | 2 314 206 A | 12/1997 | |

* cited by examiner

Primary Examiner—Nathan Flynn
Assistant Examiner—Ahmed N. Sefer
(74) Attorney, Agent, or Firm—Laurence A. Greenberg; Werner H. Stemer; Ralph E. Locher

(57) ABSTRACT

A semiconductor configuration includes a substrate having a first conduction type. A transistor configuration is disposed at the substrate and is formed from at least one field-effect transistor having at least two doped regions embedded in the substrate and at least one gate electrode. The regions have a second conduction type, are disposed between the transistor configuration and the substrate edge, and extend from the substrate surface into the substrate and surround the transistor configuration. At least two adjacent insulating trench regions are disposed between the regions and extend from the substrate surface into the substrate for isolating the doped regions from one another. The trenches may have a smaller depth than the doped regions. A method for fabricating a semiconductor configuration includes providing a substrate having a first conduction type and producing regions in the substrate by introducing a dopant. The regions have a second conduction type. They extend from the surface of the substrate into the substrate and are isolated from one another in the substrate. A trench is produced at the boundary of each one of the regions facing a respective other one of the regions. Each trench has a depth greater than a depth of the respective at least two regions after introducing the dopant but less than a desired depth of the regions. The dopant is outdiffused to a desired depth greater than the depth of each respective trench. Each trench is filled by forming an insulating layer therein.

20 Claims, 5 Drawing Sheets

SEMICONDUCTOR CONFIGURATION HAVING TRENCHES FOR ISOLATING DOPED REGIONS

CROSS-REFERENCE TO RELATED APPLICATION

This application is a continuation of copending International Application No. PCT/DE99/00012, filed Jan. 7, 1999, which designated the United States.

BACKGROUND OF THE INVENTION

Field of the Invention

The invention lies in the field of semiconductors.

One of the common problems encountered in the fabrication of semiconductor components is effective isolation of doped regions in the semiconductor substrate. The problem area arises, in particular, when a semiconductor component contains doped regions that are indiffused relatively far. Examples thereof are CMOS wells in integrated circuits or annular doping regions that surround the cell array in power transistors or IGBTs and are intended to dissipate the current flowing in the edge area. In many cases, these regions are intended to be spatially and electrically isolated from other doping regions.

One possibility for electrically and spatially isolating doped regions would be to implant them with such a large spacing that they do not diffuse into one another in the course of the subsequent diffusion processes, but rather maintain a sufficiently large spacing. In such a case, the spacing of the implantations must be larger than the spacing desired at the end of the fabrication process by a sum of the extents of the outdiffusion from the doping regions. Therefore, undesirably large structures are produced for deep diffusion regions.

U.S. Pat. No. 5,525,821 to Harada et al. describes a method in which diffusion regions are produced first. These diffusion regions are subsequently isolated from one another by deep trench structures. Although the method makes it possible to fabricate structures with a small lateral extent, there is nonetheless, a disadvantage that the depth of the trenches must reach at least the depth of the diffusion regions. Consequently, more complicated patterning steps are required. There are also more limitations if the intention is to provide for the fabrication of additional trenches, which are intended to be utilized for trench transistors, for example, at the same time as the trenches, for isolating the diffusion regions. Because the diffusion regions already predetermine the depth of the trenches, adequate patterning freedoms no longer remain for optimizing the trench transistors.

Moreover, isolating diffusion regions by trenches that are allowed to have a smaller depth than the diffusion regions is disclosed in U.S. Pat. No. 5,430,324 to Bencuya or in British Patent No. GB 2,314,206. However, there are two problem areas associated with these references. First of all, doping regions have to be implanted with a sufficiently large spacing. On the other hand, there is a risk that the small depth of the trenches does not ensure sufficient spatial and electrical isolation of the doped regions.

SUMMARY OF THE INVENTION

It is accordingly an object of the invention to provide a semiconductor configuration having trenches for isolating doped regions that overcomes the hereinafore-mentioned disadvantages of the heretofore-known devices and methods of this general type and that provides a possibility for effectively isolating doped regions by trenches in a semiconductor substrate and allows the smallest possible structure sizes and the greatest possible freedoms in the configuration of the trenches.

With the foregoing and other objects in view, there, is provided, in accordance with the invention, a semiconductor configuration, including a substrate having a first conduction type, an edge, and a surface, a transistor configuration disposed at the substrate, the transistor configuration formed from at least one field-effect transistor having at least two doped regions embedded in the substrate and at least one gate electrode, at least two regions having a second conduction type and disposed between the transistor configuration and the substrate edge, the at least two regions extending from the surface of the substrate into the substrate and surrounding the transistor configuration, and at least two adjacent insulating trench regions disposed between the at least two regions and extending from the surface of the substrate into the substrate, the at least two regions isolated from one another by the at least two adjacent insulating trench regions.

As already described, the necessity of isolating doped regions in different areas of a semiconductor configuration may arise. Thus, it may be necessary to isolate doped regions, for example, in the active area of a semiconductor configuration, i.e., in that area in which the transistors are disposed. Likewise, the case may arise where doped regions in the area of the edge structures of the semiconductor configuration, i.e., between the transistor configuration and the substrate edge, have to be isolated from one another. In such an area, for example, it is possible to provide doped regions between the transistor configuration and the substrate edge, which extend from the surface of the substrate into the substrate and surround the transistor configuration as a ring. The transistor configuration, itself, may be made from any desired number and type of transistors. In particular, transistors that are configured as field-effect transistors and have at least two doped regions embedded in the substrate. Also, at least one gate electrode can be used. In principle, however, it is also possible to provide bipolar transistors, for example.

For effective isolation of the doped regions, at least two adjacent, insulating trench regions are now respectively provided that are disposed between the doped regions and extend from the surface of the substrate into the substrate. Consequently, according to the invention, not just one individual trench is situated between two doped regions— such a trench being inadequate, under certain circumstances, for effective isolation. Rather, two or more trenches are disposed between the doped regions. Thus, even with trenches having a relatively small depth that is smaller than the depth of the doped regions, very good electrical and spatial isolation of the doped regions can still be obtained. The depth of the trenches can be adapted to the conditions for producing trench transistors, for example.

As described, the present invention affords relatively great freedoms in the configuration of the depth of the trenches for isolating the doped regions. Thus, these trenches may have a depth that is smaller than the depth of the doped regions. Of course, it is also possible to provide trenches whose depth corresponds to the depth of the doped regions, or whose depth is greater than the depth of the doped regions.

The trenches can be filled with different materials. Thus, for example, each trench region or at least a portion of the trench regions can be filled with an insulation layer or can be formed by an insulation layer. As an alternative, however, a conductive layer surrounded by an insulation layer can be present in the trench region. All that has to be ensured is that sufficient insulation of the doped regions relative to one another can be attained. Consequently, different materials that can be adapted to the respective conditions can also be chosen for the insulation layer or the conductive layer in the trench region. An oxide layer or a nitride layer, for example, may be provided as the insulation layer, and a polysilicon layer, for example, may be provided as the conductive layer.

In accordance with another feature of the invention, each of the trench regions is formed by a conductive layer surrounded by an insulation layer.

If trench regions being made from a conductive layer are provided, then it is possible to provide conductive interconnection between the individual trench regions. Such a configuration achieves an ability to hold the interconnected trench regions at a uniform potential. In this case, in order to obtain an exactly defined potential, individual trenches or all of the trenches that have a conductive layer can be connected to one of the electrodes of the transistor configuration, for example, to a gate electrode or a cathode electrode. Thus, for example, at least the innermost trench regions, which are disposed nearest to the transistor configuration, can be conductively connected to a gate electrode or a cathode electrode.

In accordance with a further feature of the invention, at least the conductive layer of each of the at least two trench regions are conductively interconnected.

In accordance with an added feature of the invention, one of the doped regions is a cathode electrode, and at least an innermost one of the trench regions nearest to the transistor configuration is conductively connected to at least one of the gate electrode and the cathode electrode.

In accordance with an additional feature of the invention, an innermost one of the trench regions nearest to the transistor configuration is conductively connected to the gate electrode.

In accordance with yet another feature of the invention, one of the doped regions is a cathode electrode, and at least an innermost one of the trench regions nearest to the transistor configuration is conductively connected to the cathode electrode.

In accordance with yet a further feature of the invention, at least an innermost region of the regions adjoining the transistor configuration is a floating region.

The doped regions may either be configured as floating regions or be held at a defined potential by a conductive connection, for example, to an electrode of the transistor configuration. It is preferably provided that at least the innermost doped region, which adjoins the transistor configuration, is a floating region, in other words, is not held at a defined potential. The configuration is expedient particularly when the best possible carrier flooding is desired in the area of the transistor configuration, as is the case with trench IGBTs.

On the other hand, it is preferably provided that at least the outermost doped region, which is the nearest to the substrate edge, is conductively connected to an electrode of the transistor configuration, in particular, to a cathode electrode. The effect that can be achieved thereby is that holes can be conducted away more effectively from the edge area during switching operations and the switching behavior of the semiconductor configuration can be optimized.

In accordance with yet an added feature of the invention, the doped regions are cathode electrodes, and at least an outermost region of the regions nearest to the substrate edge is conductively connected to the cathode electrodes.

In accordance with yet an additional feature of the invention, there is provided a channel stopper and at least one of at least one field plate and at least one field ring is disposed between the at least two regions and the substrate edge.

In accordance with again another feature of the invention, there are provided field rings and field plates, a respective one of the field rings-being connected to a respective one of the field plates to form an overlap therebetween, the overlap forming a cascode and being disposed in an area of the transistor configuration.

In accordance with again a further feature of the invention, there is provided a further field plate, the channel stopper is a layer having a conduction type selected from the group consisting of the first conduction type and the second conduction type, and the channel stopper is disposed at the substrate edge and is connected to the further field plate.

It has been described that the idea according to the invention can be used for a configuration that can be disposed between the active area of a semiconductor configuration, i.e., the transistor configuration, and the substrate edge. In such a case, further edge structures can be additionally provided between the configuration according to the invention and the actual substrate edge. Thus, for example, field plates or field rings, as well as a channel stopper, additionally may be provided in the area. It is also possible to provide a combination of these individual edge structure elements. Thus, for example, a plurality of field plates and field rings may be provided, a respective field ring being connected to a field plate. The combination of field plate with field ring may likewise be disposed differently with respect to the respective adjacent combination of field plate and field ring. Thus, it is possible that these configurations are made to not overlap one another at all. Such a configuration without any overlap may be provided, for example, in the outer area of the edge structure, in other words, in the vicinity of the substrate edge. On the other hand, it is also possible to provide an overlap between the field plate of one combination of field plate and field ring and the field ring of the nearest combination of field plate and field ring in the form of a cascode circuit. Such a configuration is preferably proposed for that area of the edge structure that is nearest to the transistor configuration. The field plates or the field rings of the edge structure may be held at a defined potential by a conductive connection to an electrode of the transistor configuration.

In accordance with again an added feature of the invention, there is provided a further layer having the second conduction type, the layer has a first conduction type and is surrounded by the further layer.

In accordance with again an additional feature of the invention, one of the doped regions is a cathode electrode, and the at least one field plate is conductively connected to one of the cathode electrode and the gate electrode.

Various configurations may be realized for the channel stopper, too, which is generally disposed directly at the substrate edge. Thus, for example, the channel stopper may be solely a doped layer that has the same conduction type as the substrate or the opposite conduction type and is disposed at the edge of the substrate. However, the channel stopper may also be formed by a combination of such a layer with a field plate, which are both conductively connected to one another. In a further embodiment, it may be provided that the doped layer of the channel stopper is surrounded by a further layer of the opposite conduction type. As a result, the effect of the doped layer as a channel stopper is reduced and the actual effect of the channel stopper is largely restricted to the field plate.

With the objects of the invention in view, there is also provided a method for fabricating a semiconductor configuration, including providing a substrate having a first conduction type and a surface, producing at least two regions in the substrate by introducing a dopant into the at least two regions, the at least two regions having a second conduction type, a desired depth, and a boundary, extending from the surface of the substrate into the substrate, and being isolated from one another in the substrate, producing a trench at the boundary of each one of the at least two regions facing a respective other one of the at least two regions, each trench having a depth greater than a depth of the respective at least two regions after introducing the dopant but less than a desired depth of the at least two regions, outdiffusing the dopant to the desired depth greater than the depth of each respective trench, and filling each trench by forming an insulating layer therein.

In accordance with still another mode of the invention, the producing step is carried out by introducing the dopant by implantation through a screen oxide on a surface of the substrate.

In accordance with a concomitant mode of the invention, the filling step is carried out by forming the insulating layer by producing an insulation layer inside each trench and on a surface of the substrate, and subsequently filling each trench with a conductive layer.

The method according to the invention allows the fabrication of a semiconductor configuration having at least two doped regions that are structurally and electrically isolated from one another. First, a dopant is introduced into a semiconductor substrate in the area of the regions to be produced. The doping material can be introduced into the semiconductor substrate in different ways, where all conventional methods from the prior art can be employed. For example, the dopant can be introduced into the semiconductor substrate by implantation, the implantation being effected through a screen oxide on the surface of the substrate. After the introduction of the dopant, a first diffusion step may be provided that results in outdiffusion of the dopant to a depth that is smaller than the desired depth of the subsequent completed doped regions. The first diffusion step may also be omitted, however, so that a suitable implantation is effected just in a first step.

The spacing with which these regions are introduced into the substrate should be chosen to be somewhat larger than the desired spacing of the subsequent regions that have been completed. However, the spacing must not be chosen to be larger than the sum of the subsequently desired structure spacing and—in the case of a first diffusion step—twice the extent of the outdiffusion in the first diffusion step.

The introduction of the dopant is followed by the production of a trench at the respective boundary of each of the doped regions that faces the respective other region. In this case, the trench merely has to have a depth greater than the depth of the regions after the introduction of the dopant and, if appropriate, after subsequent first outdiffusion. However, the depth of the trench can be chosen to be less than the depth of the subsequent doped regions. If, for example, the depth of the trenches is predetermined by a corresponding patterning step for simultaneously fabricating trench transistors, then the introduction of the dopant and, if appropriate, a first outdiffusion step can be matched to these stipulations so that the introduction of the dopant and possible first outdiffusion do not exceed the depth of the trenches.

The fabrication of the trenches is followed by a second outdiffusion of the dopant to the desired depth, which, as a rule, will be greater than the depth of the trenches. However, because at least two trenches have been produced between two respective doped regions, despite outdiffusion to a depth greater than the depth of the trenches, there is no risk of the doped regions merging with one another as a result of the outdiffusion, or of sufficient spatial isolation failing to be ensured.

An insulating layer may subsequently fill the trenches that have been formed. The insulating layer may be made completely of insulation material such as an oxide or a nitride, or it may be formed as a multilayer structure, first by lining the trench with an insulating layer and then filling the trench with a further layer, for example, made of conductive material. Thus, for example, in order to form the insulating layer, an insulation layer may be produced on the insides of the trenches and on the surface of the substrate, for example, by oxidation of the semiconductor substrate to form silicon oxide. Subsequently, the trench is filled with a conductive layer, for example, polysilicon.

Other features that are considered as characteristic for the invention are set forth in the appended claims.

Although the invention is illustrated and described herein as embodied in a semiconductor configuration having trenches for isolating doped regions, it is, nevertheless, not intended to be limited to the details shown since various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
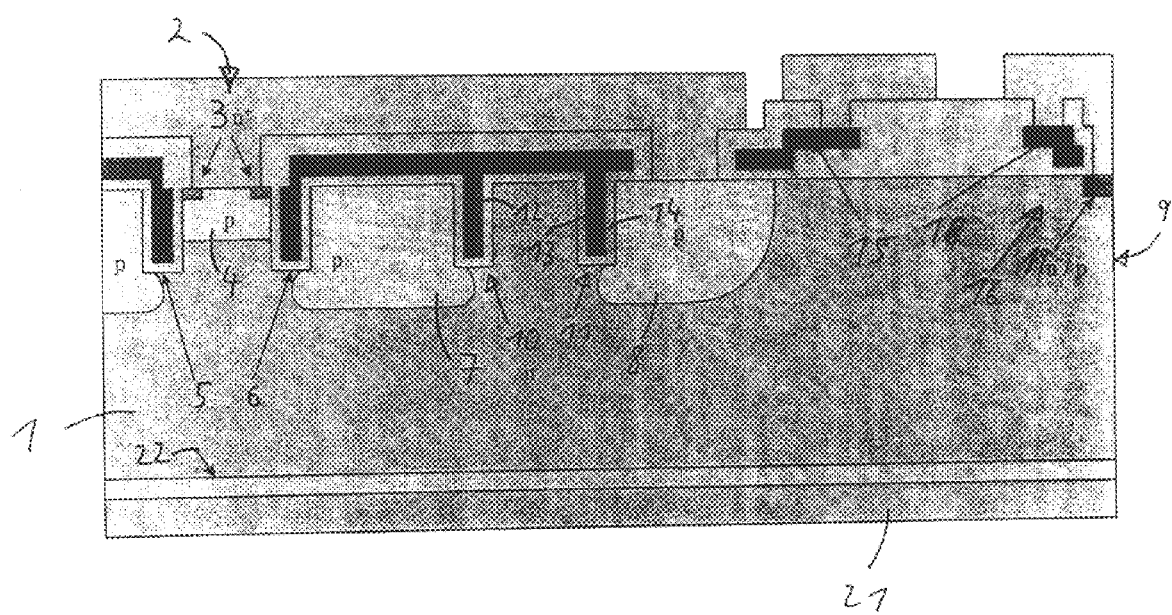
FIG. 1 is a partial, enlarged, cross-sectional view through a semiconductor configuration with a trench IGBT and an edge structure according to the invention.

In all the figures of the drawing, sub-features and integral parts that correspond to one another bear the same reference symbol in each case.

Referring now to the figures of the drawings in detail and first, particularly to FIG. 1 thereof, there is shown a semiconductor configuration. The configuration illustrates an IGBT with two trench-type gate electrodes 5, 6 as part of a transistor configuration 2, a p-type body region 4, and n$^+$-type source regions 3 embedded in an n-type substrate 1. An anode layer 22 of the p conduction type is furthermore provided in the substrate 1. A metallization layer 21 is applied to the anode layer 22. Two p-type doped regions 7 and 8 extend into the substrate 1. These two regions are isolated from one another by two trenches 10 and 11. Each of the trenches 10, 11 is lined with an insulation layer 14. The same insulation layer 14 also forms the gate oxide layer of the gate electrodes 5, 6. The trenches 10, 11 are filled with a conductive layer 12 and 13 formed by the same layer as the conductive layer of the gate electrodes 5, 6. Thus, the trenches 10 and 11 can be produced simultaneously with the gate electrodes 5, 6 in a patterning step. The insulation layer 14 may be an oxide layer, and the conductive layers 12, 13 may be polysilicon layers.

The doped region 7 adjoining the gate electrode 6 of the IGBT is a floating region. The configuration makes it possible to ensure improved carrier flooding during operation of the IGBT. The second doped region 8, on the other hand, is conductively connected to the source regions 3. Thus, the second doped region 8 is held at source potential.

An edge structure is provided between the doped regions 7, 8 and the substrate edge 9. Field plates and a channel stopper form the edge structure in the exemplary embodiment according to FIG. 1. For example, a field plate 15 is embedded in an oxide layer and is disposed above the substrate 1. The field plate 15 is conductively connected either to a source electrode 3 or to a gate electrode 5, 6. The channel stopper 16 is formed by a doped layer 19, which may be either of the n-conduction type or of the p-conduction type and is disposed directly at the substrate edge 9. The doped layer 19 is conductively connected to a field plate 18, which is likewise embedded in an oxide layer and disposed above the substrate 1.

Figure 2:
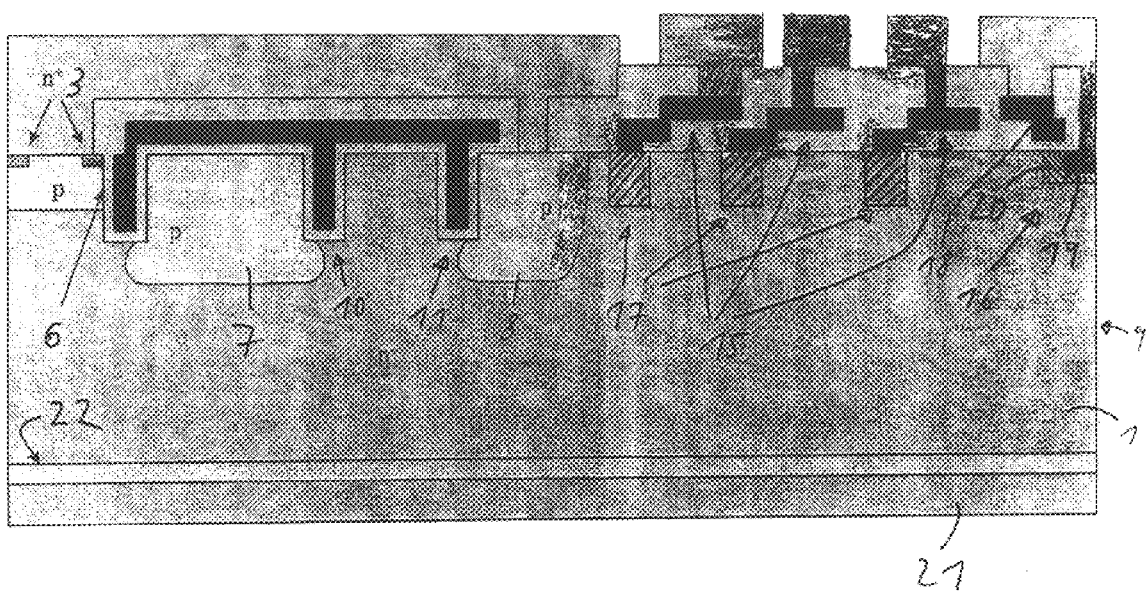
FIG. 2 is a partial, enlarged, cross-sectional view of an alternative embodiment of the edge structure in accordance with FIG. 1.
Figure 3:
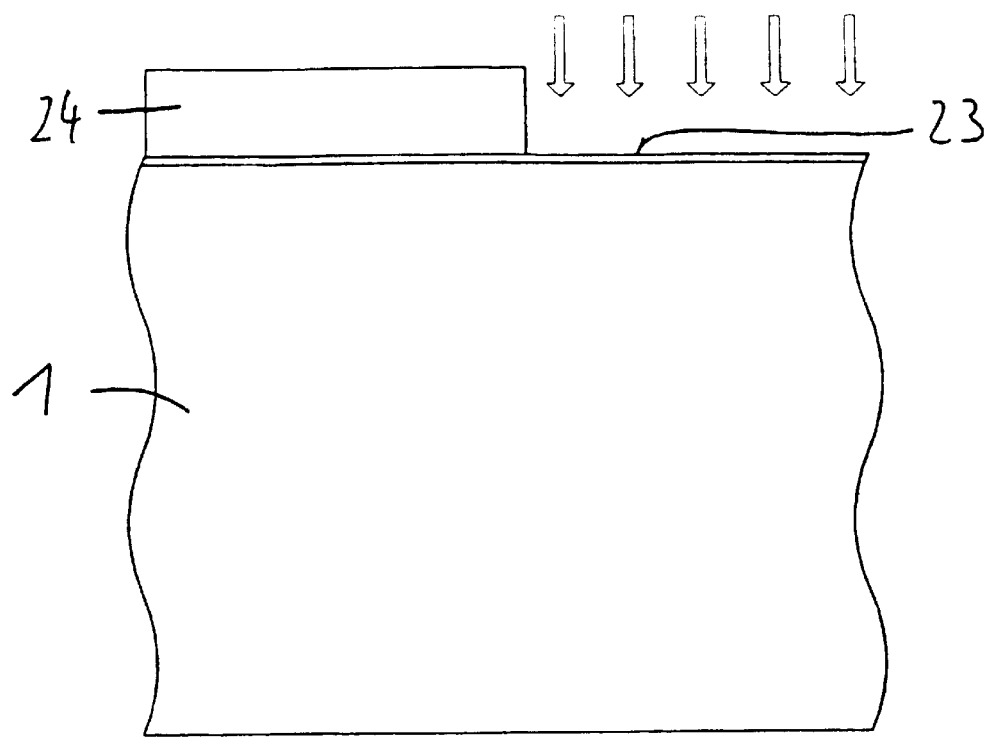
FIGS. 3 to 7 are enlarged, fragmentary cross-sectional views showing the method steps for fabricating two doped regions that are isolated from one another by two insulating trench regions according to the invention.
Figure 4:
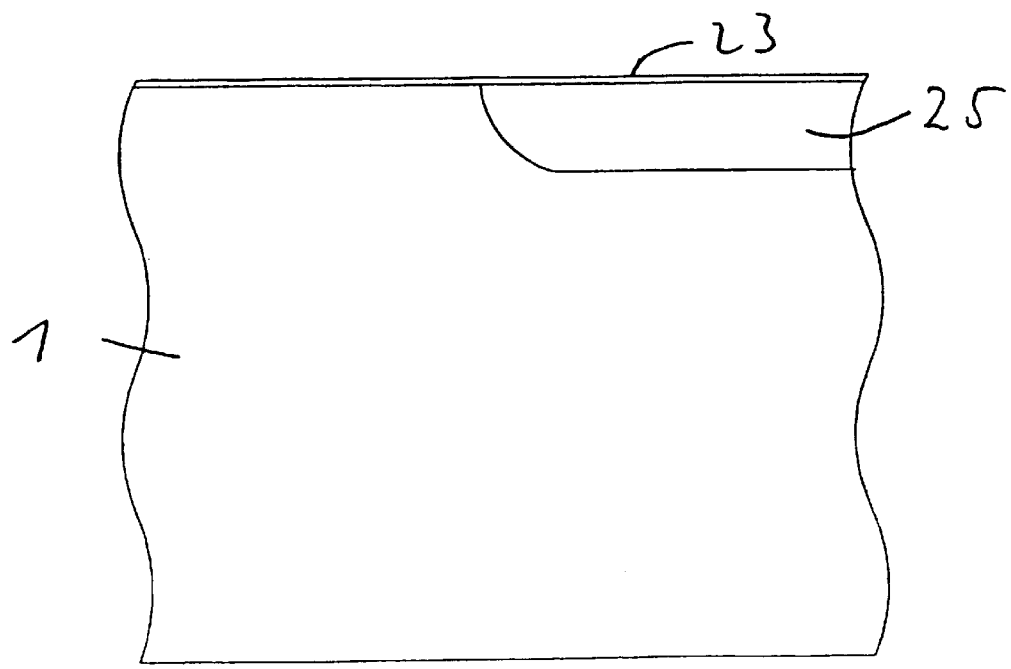
Figure 5:
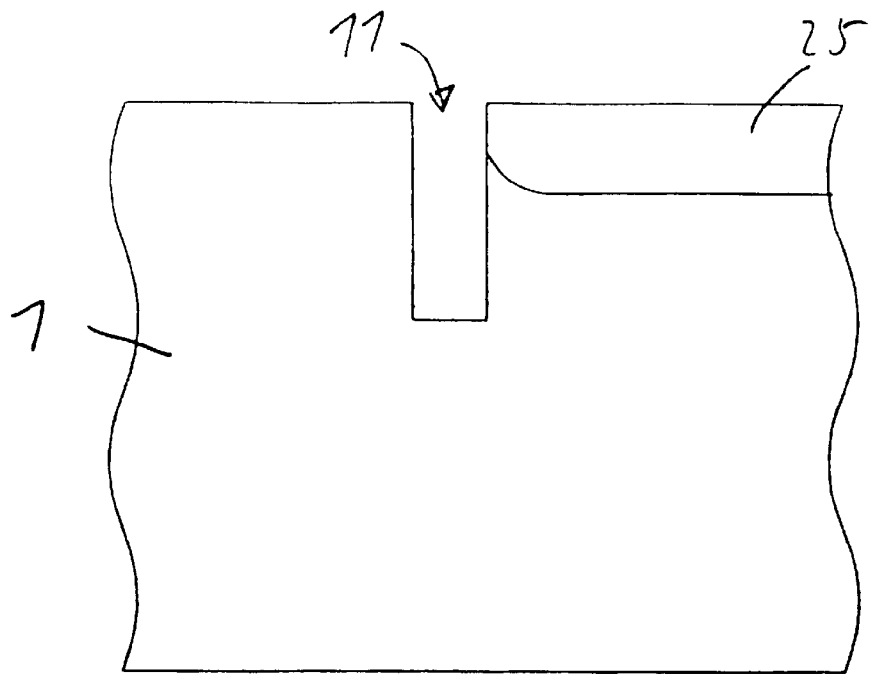

An alternative embodiment of the edge structure is illustrated in FIG. 2. A plurality of field plates 15 are each connected to a field ring 17, which is embedded as a doped region in the substrate 1. In the edge structure area that adjoins the doped regions 7, 8, the field plates 15 overlap the respectively adjoining field ring 17 in the form of a cascode. In contrast, in the edge structure area disposed in the area of the substrate edge 9, the field plates do not overlap adjoining field plates or field rings at all.

A field plate 18 and a doped region 19, which are interconnected conductively, in turn, form the channel stopper 16. However, in this case, the doped region 19, which has n-type doping for example, is also surrounded by a further layer of opposite conduction type, i.e., a p-type layer. Thus, the effect of the channel stopper is largely restricted to the effect of the field plate 18.

The examples according to FIGS. 1 and 2 each illustrate two doped regions 7, 8 isolated by two trenches 10, 11, the trenches being interconnected conductively and conductively connected to a gate electrode 6. However, it is also possible to provide more than just two doped regions 7, 8; equally, it is also possible to provide more than just two trenches 10, 11. The edge structures of FIGS. 1 and 2 have been illustrated only by way of example; it is also possible to use a larger number of field plates 15 and field rings 17 than illustrated in FIGS. 1 and 2.

FIGS. 3 to 7 diagrammatically show the steps for fabricating the two doped regions 7, 8 isolated from one another by two trenches 10, 11.

In a first step (FIG. 3), implantation is effected through a screen oxide 23 into a substrate 1. A mask 24 covers an area of the substrate. In a first diffusion step (FIG. 4), a diffusion region 25 is produced. The depth of diffusion region 25 is smaller than the desired depth of the subsequent region 8 that has been outdiffused to completion. The screen oxide 23 is removed from the substrate surface (FIG. 5) and a trench 11 is patterned into the substrate. The trench 11 has a larger depth than the diffusion region 25, but a smaller depth than the subsequent region 8 that has been outdiffused to completion.

Figure 6:
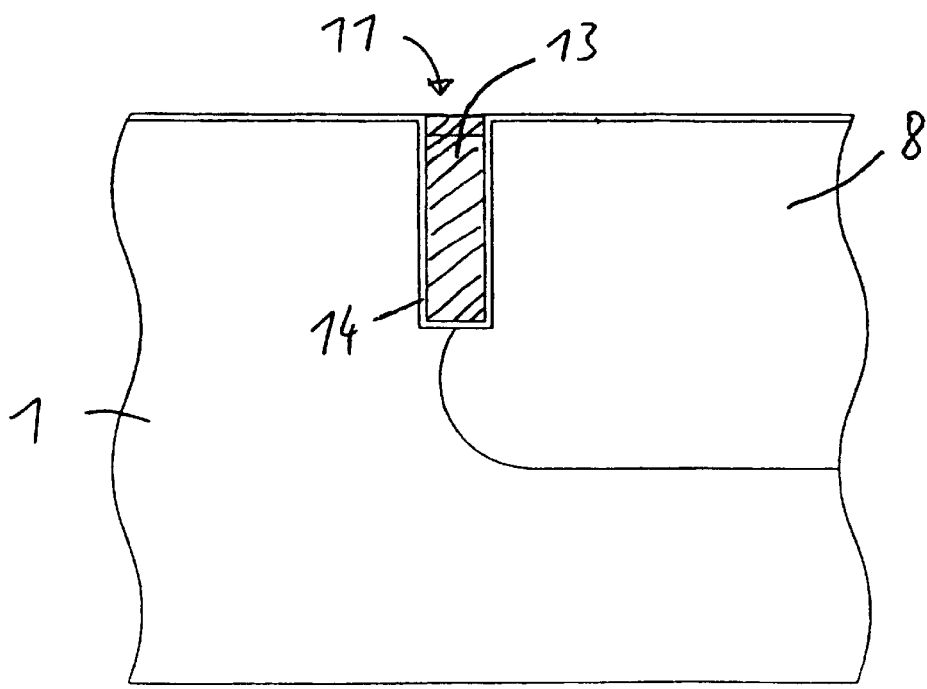

In a second diffusion step, the doping material is outdiffused to the desired depth of the region 8 that has been outdiffused to completion. As illustrated in FIG. 6, the depth may be larger than the depth of the trench 11. Finally, an insulation layer 14 is formed on the substrate surface and the inner walls of the trench 11, and the trench is filled with a conductive layer 13. In principle, the trench filling operation may also be effected before the second diffusion step for finally forming the region 8.

Figure 7:
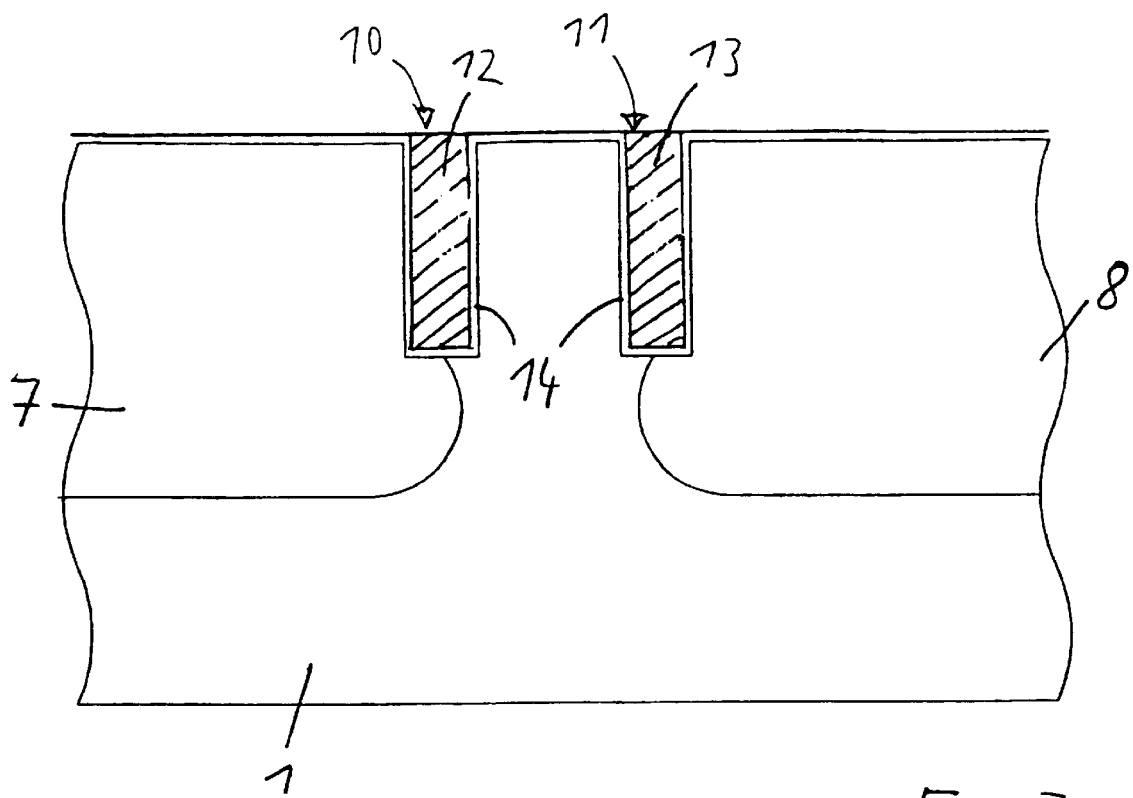

The formation of the second doped region 7 and of the second trench 10 is effected in parallel with the formation of the region 8 and of the trench 11. For reasons of simplicity, FIGS. 3 to 6 illustrate merely the formation of the region 8 and of the trench 11. FIG. 7 shows the completed configuration including the two doped regions 7, 8, which are isolated from one another by two trenches 10, 11. Both trenches are filled with a conductive layer 12, 13. The trenches 10, 11 can be produced in a common step, for example, by deposition of polysilicon, the conductive layer 12, 14 being surrounded by an insulation layer 14, which can likewise be produced in a common step, for example, by oxidation of the substrate.

I claim:

1. A semiconductor configuration, comprising:
   a substrate having a first conduction type, an edge, and a surface;
   a transistor configuration disposed at said substrate, said transistor configuration formed from at least one field-effect transistor having at least two doped regions embedded in said substrate and at least one gate electrode;
   at least two regions having a second conduction type and disposed between said transistor configuration and said substrate edge, said at least two regions extending from said surface of said substrate into said substrate and surrounding said transistor configuration; and
   at least two insulating trench regions each disposed adjacent one of said at least two regions and between said at least two regions and extending from said surface of said substrate into said substrate, said at least two regions isolated from one another by said at least two insulating trench regions, said at least two trench regions having a depth smaller than said at least two regions.

2. The semiconductor configuration according to claim 1, wherein each of said at least two trench regions is formed by an insulation layer.

3. The semiconductor configuration according to claim 1, wherein each of said at least two trench regions is formed by a conductive layer surrounded by an insulation layer.

4. The semiconductor configuration according to claim 3, wherein at least said conductive layer of each of said at least two trench regions are conductively interconnected.

5. The semiconductor configuration according to claim 4, wherein one of said at least two doped regions is a cathode electrode, and at least an innermost one of said at least two trench regions nearest to said transistor configuration is conductively connected to at least one of said at least one gate electrode and said cathode electrode.

6. The semiconductor configuration according to claim 4, wherein at least an innermost one of said at least two trench regions nearest to said transistor configuration is conductively connected to said at least one gate electrode.

7. The semiconductor configuration according to claim 4, wherein one of said at least two doped regions is a cathode electrode, and at least an innermost one of said at least two trench regions nearest to said transistor configuration is conductively connected to said cathode electrode.

8. The semiconductor configuration according to claim 1, wherein at least an innermost region of said at least two regions adjoining said transistor configuration is a floating region.

9. The semiconductor configuration according to claim 1, wherein said at least two doped regions are cathode electrodes, and at least an outermost region of said at least two regions nearest to said substrate edge is conductively connected to said cathode electrodes.

10. The semiconductor configuration according to claim 1, including a channel stopper and at least one of at least one field plate and at least one field ring disposed between said at least two regions and said substrate edge.

11. The semiconductor configuration according to claim 10, including field rings and field plates, a respective one of said field rings being connected to a respective one of said field plates to form an overlap therebetween, said overlap forming a cascode and being disposed in an area of said transistor configuration.

12. The semiconductor configuration according to claim 11, including a further field plate, said channel stopper being a layer having a conduction type selected from the group consisting of said first conduction type and said second conduction type, said channel stopper being disposed at said substrate edge and being connected to said further field plate.

13. The semiconductor configuration according to claim 12, including a further layer of said second conduction type, said layer having a first conduction type and being surrounded by said further layer.

14. The semiconductor configuration according to claim 11, wherein one of said at least two doped regions is a cathode electrode, and at least one of said field plates is conductively connected to one of said cathode electrode and said at least one gate electrode.

15. The semiconductor configuration according to claim 10, including a further field plate, said channel stopper being a layer having a conduction type selected from the group consisting of said first conduction type and said second conduction type, said channel stopper being disposed at said substrate edge and being connected to said further field plate.

16. The semiconductor configuration according to claim 15, including a further layer having said second conduction type, said layer having a first conduction type and being surrounded by said further layer.

17. The semiconductor configuration according to claim 10, wherein one of said at least two doped regions is a cathode electrode, and said at least one field plate is conductively connected to one of said cathode electrode and said at least one gate electrode.

18. The semiconductor configuration according to claim 1, including a channel stopper and at least one field plate disposed between said at least two regions and said substrate edge.

19. The semiconductor configuration according to claim 18, wherein one of said at least two doped regions is a cathode electrode, and said at least one field plate is conductively connected to one of said cathode electrode and said at least one gate electrode.

20. The semiconductor configuration according to claim 1, including a channel stopper and at least one field ring disposed between said at least two regions and said substrate edge.

* * * * *